(12) United States Patent
Bal

(10) Patent No.: US 6,624,771 B2
(45) Date of Patent: Sep. 23, 2003

(54) CONCURRENT LOGIC OPERATIONS USING DECODER CIRCUITRY OF A LOOK-UP TABLE

(75) Inventor: Ankur Bal, Ghaziabad (IN)

(73) Assignee: STMicroelectronics Ltd., Uttar Pradesh (IN)

(*) Notice: Subject to any disclaimer, the term of this patent is extended or adjusted under 35 U.S.C. 154(b) by 0 days.

(21) Appl. No.: 10/145,390

(22) Filed: May 14, 2002

(65) Prior Publication Data

US 2002/0175703 A1 Nov. 28, 2002

(30) Foreign Application Priority Data

May 14, 2001 (IN) .................................................. 570/01

(51) Int. Cl.$^7$ ............................................... H03M 7/00
(52) U.S. Cl. ....................................................... 341/106
(58) Field of Search ................................ 341/51, 52, 87, 341/106, 95, 107

(56) References Cited

U.S. PATENT DOCUMENTS

| | | | | |
|---|---|---|---|---|
| 4,988,998 A | * | 1/1991 | O Brien | 341/51 |
| 5,745,734 A | * | 4/1998 | Craft et al. | 341/106 |
| 6,037,829 A | | 3/2000 | Reddy et al. | 327/408 |

* cited by examiner

*Primary Examiner*—Brian Young
(74) *Attorney, Agent, or Firm*—Lisa K. Jorgenson; Allen, Dyer, Doppelt, Milbrath & Gilchrist, P.A.

(57) ABSTRACT

A look-up table circuit includes address decoder circuitry that includes circuitry for utilizing the address decoder circuitry for producing secondary functions concurrently with operation of the address decoding operations. This eliminates or reduces additional circuitry required for generating the secondary functions.

20 Claims, 5 Drawing Sheets

CONCURRENT LOGIC OPERATIONS USING DECODER CIRCUITRY OF A LOOK-UP TABLE

FIELD OF THE INVENTION

The present invention relates to concurrent logic operations using decoder circuitry of a look-up table.

BACKGROUND OF THE INVENTION

A field programmable gate array (FPGA) includes lookup tables (LUTs), which can be programmed to implement different functions. Lookup tables are used to implement functions of 'n' inputs, where 'n' depends on the size of lookup table and the addressing scheme involved. The lookup table is most efficiently used when its number of inputs are fully utilized, and there are many combinations formed based upon the inputs. U.S. Pat. No. 6,037,829 describes an implementation for a lookup table decoder.

The Xilinx programmable logic data book (Feb. 16, 1999, Version 1.3, Pages 3–9) describes the Virtex architecture with a dedicated multiplier by adding a two input AND gate at two of the four inputs of the lookup table 4, as shown in FIG. 1. This is a dedicated multiplier, and is particularly useful while designing large multipliers. It is also useful in many other applications. The major disadvantage lies in the fact that a separate AND gate is fabricated with each LUT for achieving the AND gate functionality. A significant amount of chip area is used in fabricating the AND gates along with the lookup table.

SUMMARY OF THE INVENTION

An object of the present invention is to prevent the above described drawbacks by utilizing the decoder circuit gates of a look-up table for achieving the same functionality, and thereby eliminating the need for an additional AND gate.

Another object of the present invention is to reduce the additional circuitry required for generation of XOR/XNOR functions by using a single NOR gate.

These and other objects, features, and advantages in accordance with the present invention are provided by an improved look-up table (LUT) that includes address decoder circuitry comprising means or circuitry for utilizing the address decoder circuitry for producing secondary functions concurrently with the address decoding operations, thereby eliminating or reducing additional circuitry required for generating the secondary functions.

The means or circuitry is a selected output of the address decoder used to produce an AND function of two predetermined inputs of the decoder. The means may also be a NOR gate connected to two selected outputs of the address decoder for producing an EXCLUSIVE-OR or EXCLUSIVE-NOR function of two predetermined inputs to the decoder. The means may also be a programmable AND-NOR logic array for producing a sum-of-products/product-of-sums output from selected outputs of the address decoder.

The look-up table may be used in a configurable logic element. The present invention also provides a programmable logic device containing a plurality of configurable logic elements.

Another aspect of the present invention is to provide a method for eliminating or reducing the additional circuitry required for the generation of secondary functions. The method comprises utilizing the address decoder circuitry in the lookup table for producing the secondary functions concurrently with the address decoding operations.

The selected output of the address decoder is used to produce an AND function of two predetermined inputs of the decoder. A NOR gate may be connected to two selected outputs of the address decoder for producing an EXCLUSIVE-OR or EXCLUSIVE-NOR function of two predetermined inputs to the decoder. A programmable AND-NOR logic array may also be used for producing a sum-of-products/product-of-sums output from selected outputs of the address decoder.

BRIEF DESCRIPTION OF THE DRAWINGS

The invention will now be described with reference to the accompanying drawings.

DETAILED DESCRIPTION OF THE PREFERRED EMBODIMENTS

Figure 1:
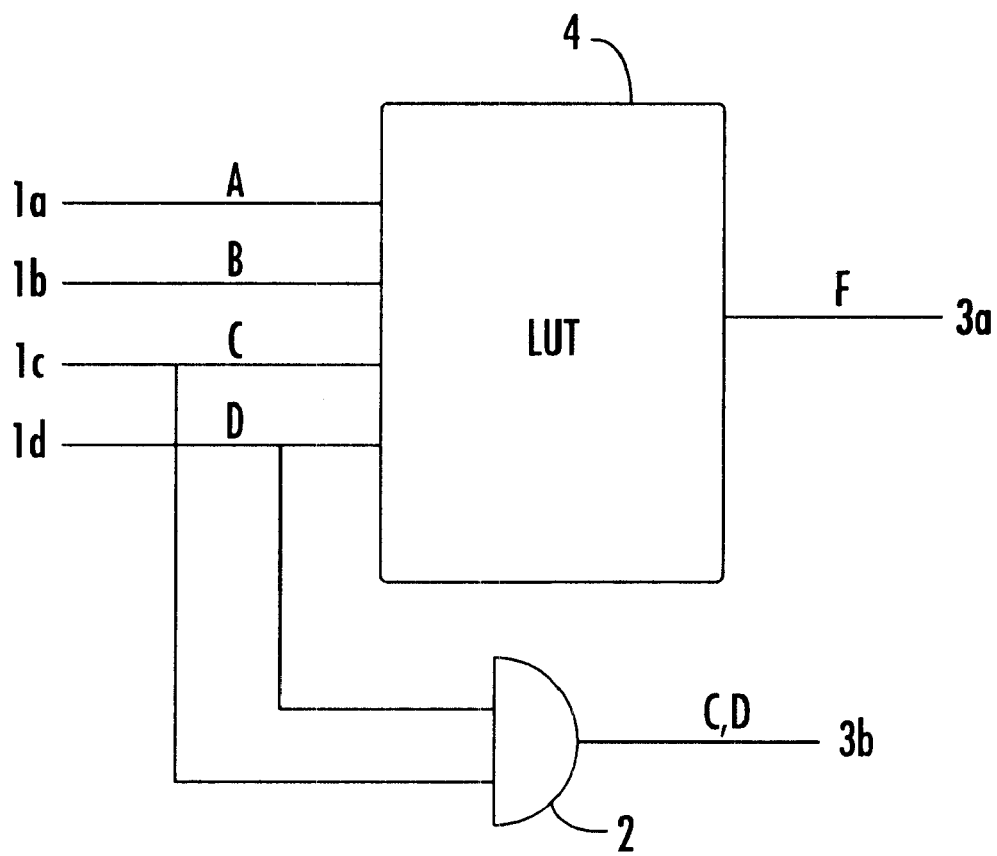
FIG. 1 illustrates a lookup table with a two input AND gate according to the prior art.

A field programmable gate array (FPGA) and a complex programmable logic device (CPLD) include a plurality of lookup tables (LUTs), and an address decoder associated with each of the lookup tables. The following description assumes a four input lookup table. Referring to FIG. 1, a four input lookup table includes four inputs labeled as A, B, C and D. Two of the many possible circuits of the lookup table address decoders are illustrated in FIGS. 2 and 3.

The address decoder circuitry is partially shown, with the upper half not being shown. Only the C and D inputs to the lookup table are shown, and the descriptions for the C and D inputs are equally valid for the A and B inputs. The primary decoder for a four input lookup table in the present embodiments includes eight NOR gates and eight AND gates as illustrated in FIGS. 2 and 3, which partially illustrates the structure. The outputs of these decoder gates drive pass transistors that connect between the lookup table latches and the output of the circuit structure. The primary decoder logic gates, if appropriately resized, may be exploited for generation of other functions, without the burden of any extra propagation delays.

Figure 2:
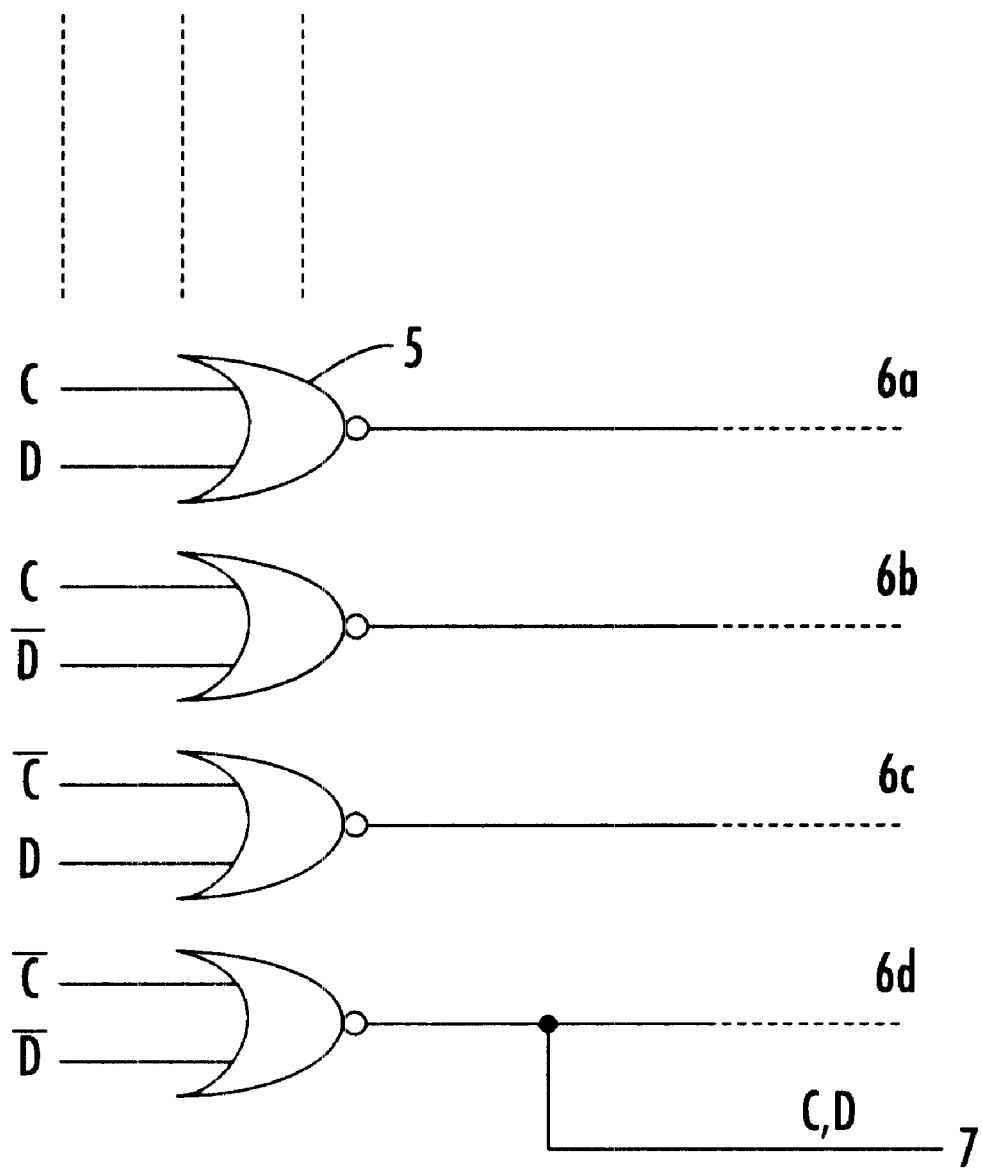
FIGS. 2 and 3 illustrate decoder circuits in accordance with the present invention used in conventional FPGAs and CPLDs.
Figure 3:
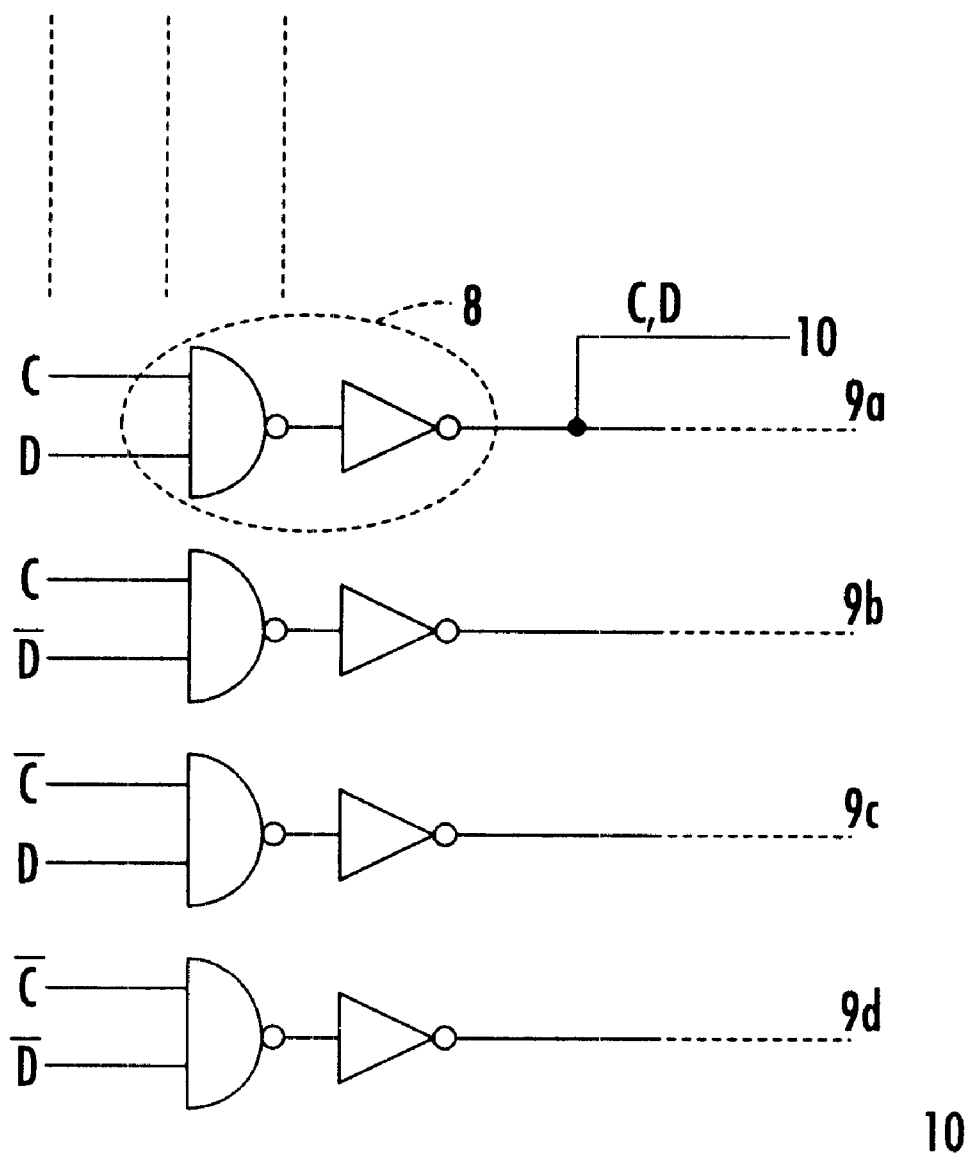
Figure 4:
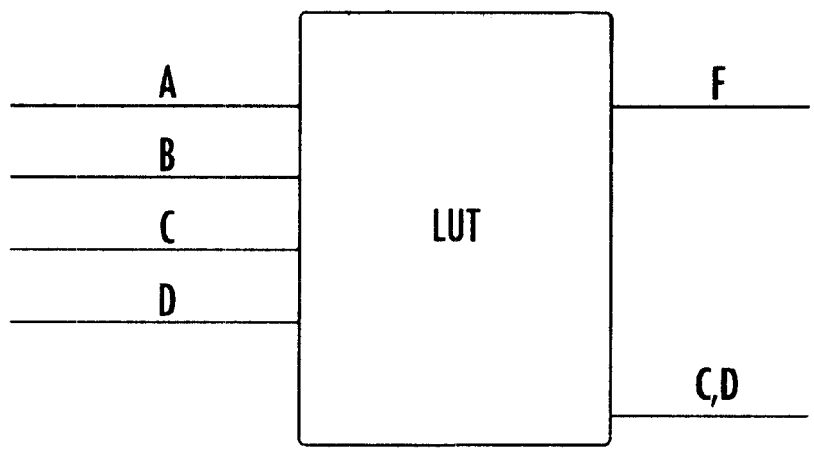
FIG. 4 illustrates a lookup table with a primary lookup table output and a secondary product term output according to the present invention.

FIGS. 2 and 3 illustrate a convenient method of obtaining a dedicated product term output from the lookup table decoder logic gates. This output is illustrated as a C, D product term in FIGS. 2 and 3 which is available at line 7 and line 10 by the inherent virtue of the decoder circuitry. Thus, the decoder circuitry does away with the need of a separate AND gate for product term functionality in FIG. 1. FIG. 4 shows a lookup table with a primary lookup table output, and a secondary product term output.

Figure 5:
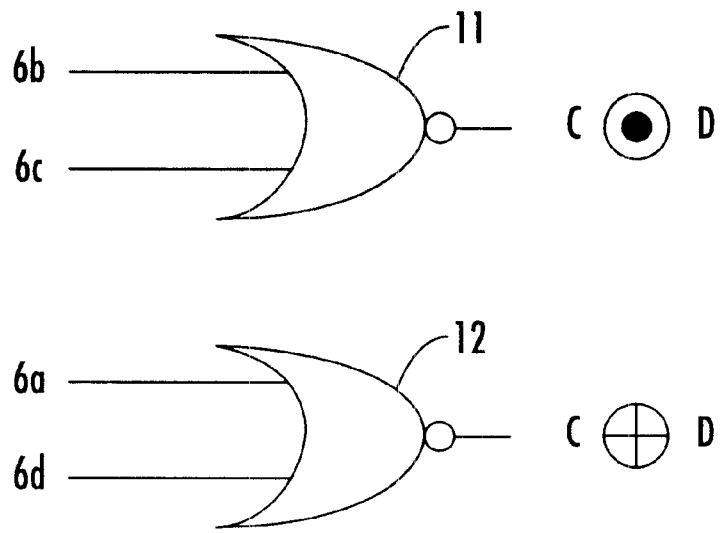
FIG. 5 illustrates XOR and XNOR gate functionalities using a single NOR gate according to the present invention.

Referring to FIG. 5, some of the other simple gate functionalities like XOR (11) and XNOR (12) are also possible from the decoder circuitry by using a single NOR gate. After appropriately resizing the decoder gates, one can tap the decoder gate outputs to generate other gate functions. A large number of such embodiments are possible as many more gates can be connected to the decoder gate outputs to generate complex functions.

Figure 6:
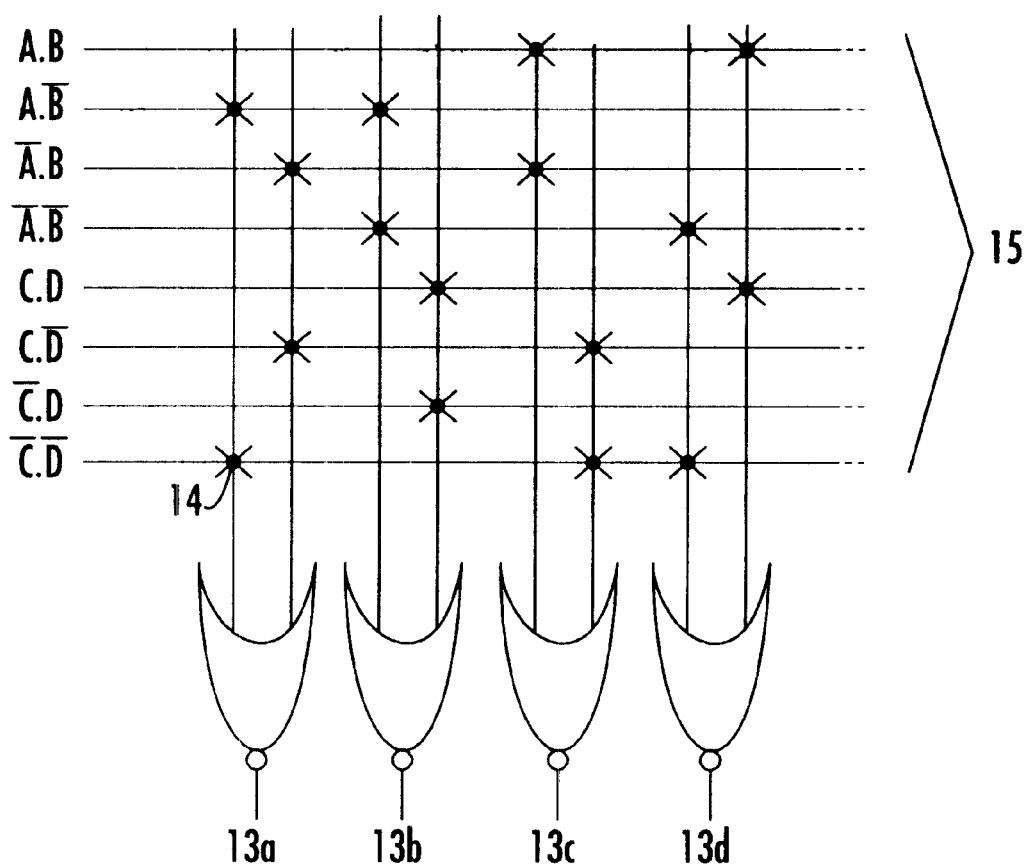
FIG. 6 illustrates a more complex and flexible embodiment using the primary decoder gates as an AND gate array along with a secondary NOR gate array for generating sum-of-product terms according to the present invention.

FIG. 6 illustrates a more complex and flexible embodiment which uses the primary decoder gates as an AND array, and a secondary NOR gate array for generating sum-of-product terms. The primary decoder/AND array outputs, which further drive the decoder pass transistors are labeled as 15.

The reference 14 depicts a configurable switch, which can either be a pass transistor or a buffer type switch. The switch arrangement shown in FIG. 6 is one of the many that are possible, and can be varied depending on the requirement. The sum-of-products/product-of-sums output is available at the output of the secondary array at 13a, 13b, 13c, 13d.

Also, any type or number of gates can form the secondary array in other embodiments. The above mentioned structures give rise to FPGA architectures with the flexibility of a lookup table and a programmable gate array with a substantial savings in hardware resources. Thus, it is clear that decoder circuitry of a lookup table can be utilized for a broad range of functions without disturbing operation of the lookup table.

That which is claimed is:

1. A lookup table circuit comprising:
   an address decoder for performing address decoding functions based upon a plurality of inputs;
   said address decoder for also performing at least one secondary function concurrently with the address decoding functions also based upon the inputs.

2. A lookup table circuit according to claim 1, wherein the at least one secondary function comprises an AND function based upon two predetermined inputs.

3. A lookup table circuit according to claim 1, wherein the at least one secondary function comprises an EXCLUSIVE-OR or EXCLUSIVE-NOR function; and wherein said address decoder comprises a NOR gate producing the EXCLUSIVE-OR or EXCLUSIVE-NOR function based upon predetermined inputs.

4. A lookup table circuit according to claim 1, wherein the at least one secondary function comprises a sum-of-products/product-of-sums function; and wherein said address decoder comprises a programmable AND-NOR logic array producing the sum-of-products/product-of-sums function.

5. A lookup table circuit according to claim 1, being implemented in a configurable logic element.

6. A lookup table circuit according to claim 5, wherein said configurable logic element comprises a field programmable gate array.

7. A lookup table circuit according to claim 5, wherein said configurable logic element comprises a complex programmable logic device.

8. An integrated circuit comprising:
   a plurality of configurable logic elements, each comprising a look-up table circuit including
   an address decoder for performing address decoding functions based upon a plurality of inputs,
   said address decoder for also performing at least one secondary function concurrently with the address decoding functions also based upon the inputs.

9. An integrated circuit according to claim 8, wherein the at least one secondary function comprises an AND function based upon two predetermined inputs.

10. An integrated circuit according to claim 8, wherein the at least one secondary function comprises an EXCLUSIVE-OR or EXCLUSIVE-NOR function; and wherein said address decoder comprises a NOR gate producing the EXCLUSIVE-OR or EXCLUSIVE-NOR function based upon predetermined inputs.

11. An integrated circuit according to claim 8, wherein the at least one secondary function comprises a sum-of-products/product-of-sums function; and wherein said address decoder comprises a programmable AND-NOR logic array producing the sum-of-products/product-of-sums function.

12. An integrated circuit according to claim 8, wherein said configurable logic elements define a field programmable gate array.

13. An integrated circuit according to claim 8, wherein said configurable logic elements define a complex programmable logic device.

14. A method for performing address decoding and at least one secondary functions comprising:
   using an address decoder for performing the address decoding functions based upon a plurality of inputs; and
   using the address decoder for also performing the at least one secondary function concurrently with the address decoding functions also based upon the inputs.

15. A method according to claim 14, wherein the at least one secondary function comprises an AND function based upon two predetermined inputs.

16. A method according to claim 14, wherein the at least one secondary function comprises an EXCLUSIVE-OR or EXCLUSIVE-NOR function; and wherein the address decoder comprises a NOR gate producing the EXCLUSIVE-OR or EXCLUSIVE-NOR function based upon predetermined inputs.

17. A method according to claim 14, wherein the at least one secondary function comprises a sum-of-products/product-of-sums function; and wherein the address decoder comprises a programmable AND-NOR logic array producing the sum-of-products/product-of-sums function.

18. A method according to claim 14, being implemented in a configurable logic element.

19. A method according to claim 18, wherein the configurable logic element comprises a field programmable gate array.

20. A method according to claim 18, wherein the configurable logic element comprises a complex programmable logic device.

* * * * *